(12) United States Patent
Cheng et al.

(10) Patent No.: US 9,822,000 B2
(45) Date of Patent: Nov. 21, 2017

(54) MEMS AND CMOS INTEGRATION WITH LOW-TEMPERATURE BONDING

(71) Applicant: Taiwan Semiconductor Manufacturing Co., Ltd., Hsin-Chu (TW)

(72) Inventors: Chun-Wen Cheng, Zhubei (TW); Chia-Hua Chu, Zhubei (TW); Jung-Huei Peng, Jhubei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/170,154

(22) Filed: Jun. 1, 2016

(65) Prior Publication Data

US 2017/0057814 A1 Mar. 2, 2017

Related U.S. Application Data

(62) Division of application No. 14/639,492, filed on Mar. 5, 2015, now Pat. No. 9,394,161.

(Continued)

(51) Int. Cl.
  *B81C 1/00* (2006.01)
  *B81B 3/00* (2006.01)
  *B81B 7/00* (2006.01)

(52) U.S. Cl.
  CPC .......... *B81C 1/00238* (2013.01); *B81B 3/001* (2013.01); *B81B 7/007* (2013.01); *B81B 2201/0235* (2013.01); *B81B 2201/0242* (2013.01); *B81B 2201/0264* (2013.01); *B81B 2203/0315* (2013.01);

(Continued)

(58) Field of Classification Search
  CPC ...... B81C 1/00238; B81B 3/001; B81B 7/007
  See application file for complete search history.

(56) References Cited

U.S. PATENT DOCUMENTS 8,201,452 B2 6/2012 Oldsen et al.
2007/0284682 A1 12/2007 Laming et al.
(Continued)

FOREIGN PATENT DOCUMENTS

CN 102610619 A 7/2012

OTHER PUBLICATIONS

Notice of Allowance dated Mar. 18, 2016 for U.S. Appl. No. 14/639,492.

*Primary Examiner* — Long Pham
(74) *Attorney, Agent, or Firm* — Eschweiler & Potashnik, LLC

(57) ABSTRACT

The present disclosure relates an integrated chip having one or more MEMS devices. In some embodiments, the integrated chip has a carrier substrate with one or more cavities disposed within a first side of the carrier substrate. A dielectric layer is disposed between the first side of the carrier substrate and a first side of a micro-electromechanical system (MEMS) substrate. The dielectric layer has sidewalls that are laterally set back from sidewalls of openings extending through the MEMs substrate to the one or more cavities. A bonding structure, including an intermetallic compound having a plurality of metallic elements, abuts a second side of the MEMS substrate and is electrically connected to a metal interconnect layer within a dielectric structure disposed over a CMOS substrate.

20 Claims, 10 Drawing Sheets

Related U.S. Application Data

(60) Provisional application No. 62/079,627, filed on Nov. 14, 2014.

(52) U.S. Cl.
CPC ..... *B81B 2207/012* (2013.01); *B81B 2207/07* (2013.01); *B81C 2201/0132* (2013.01); *B81C 2203/035* (2013.01); *B81C 2203/037* (2013.01); *B81C 2203/0792* (2013.01)

(56) References Cited

U.S. PATENT DOCUMENTS

| | | |
|---|---|---|
| 2009/0261430 A1 | 10/2009 | Suzuki et al. |
| 2010/0225898 A1 | 9/2010 | Lenke et al. |
| 2013/0277777 A1* | 10/2013 | Chang .................. B81B 7/00 257/418 |
| 2013/0334620 A1 | 12/2013 | Chu et al. |
| 2014/0103461 A1* | 4/2014 | Chu .................. H01L 24/18 257/415 |
| 2016/0009551 A1 | 1/2016 | Chang et al. |
| 2016/0060104 A1 | 3/2016 | Chu et al. |

* cited by examiner

MEMS AND CMOS INTEGRATION WITH LOW-TEMPERATURE BONDING

REFERENCE TO RELATED APPLICATION

This Application is a Divisional of U.S. application Ser. No. 14/639,492 filed on Mar. 5, 2015, which claims priority to U.S. Provisional Application No. 62/079,627 filed on Nov. 14, 2014. The contents of which are hereby incorporated by reference in their entirety.

BACKGROUND

Micro-electromechanical systems, or MEMS, is a technology that integrates miniaturized mechanical and electromechanical elements on an integrated chip. MEMS devices are often made using micro-fabrication techniques. In recent years, MEMS devices have found a wide range of applications. For example, MEMS devices are found in cell phones (e.g., accelerometers, gyroscopes, digital compasses), pressure sensors, micro-fluidic elements (e.g., valves, pumps), optical switches (e.g., mirrors), etc.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
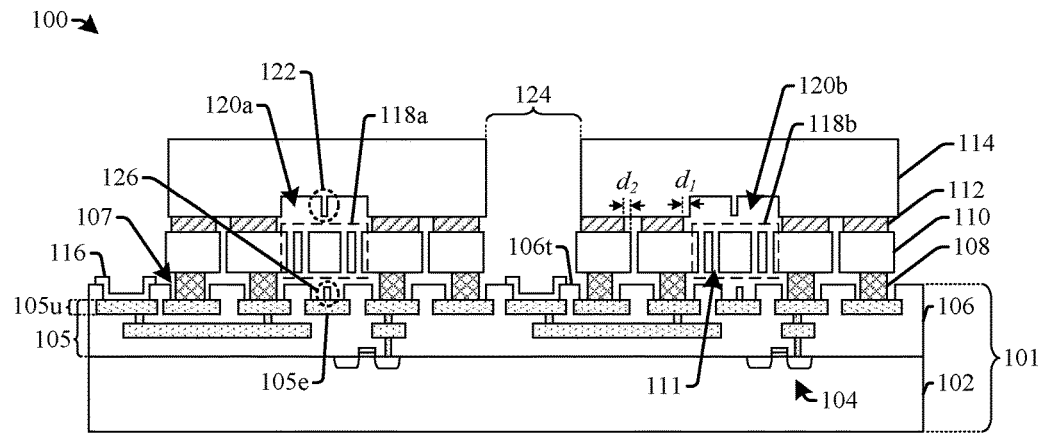
FIG. 1 illustrates a cross-sectional view of some embodiments of a disclosed integrated chip having micro-electromechanical (MEMS) devices.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

MEMS (micro-electromechanical systems) devices often comprise a moveable, soft mechanical structure abutting a cavity that allows for the soft mechanical structure to move freely during operation of the MEMS device. Such MEMS devices may be formed by a cavity first fabrication process. In a cavity first fabrication process, a cavity is formed in a carrier substrate and then the carrier substrate is bonded to a MEMS substrate so that the cavity is disposed between the MEMS substrate and the carrier substrate. After bonding, the MEMS substrate may be patterned using a dry etching process with post-etching wet clean to form a soft mechanical structure adjacent to the cavity. The MEMS substrate may be subsequently bonded to a CMOS substrate (having one or more transistor devices) using a high temperature bonding process.

It has been appreciated that cavity first fabrication processes present a number of practical difficulties. For example, it is difficult to make malleable or soft mechanical structures (e.g., an elastic diaphragm) using a cavity first process, since wet clean will cause the soft mechanical structure to stick to an interior surface of the adjacent cavities, thereby inhibiting operation of the resulting MEMS device. Furthermore, the high temperatures used to subsequently bond the MEMS substrate to the CMOS substrate may damage CMOS devices (e.g., transistors) within the CMOS substrate. Such damage will increase as the size of CMOS devices shrinks.

Accordingly, the present disclosure relates to method of forming an integrated chip having one or more MEMS devices, which mitigates the above mentioned difficulties. In some embodiments, the present disclosure relates to a method of forming a MEMS device, which forms one or more cavities within a first side of a carrier substrate. The first side of the carrier substrate is then bonded to a dielectric layer disposed on a micro-electromechanical system (MEMS) substrate. The MEMS substrate is subsequently patterned to define a soft mechanical structure over the one or more cavities. The dielectric layer is then selectively removed, using a dry etching process, to release the one or more soft mechanical structures. A CMOS substrate is bonded to a second side of the MEMS substrate, by way of a bonding structure disposed between the CMOS substrate and the MEMS substrate, using a low-temperature bonding process. Fabricating the MEMS structure using dry release and low-temperature bonding processes mitigates the above mentioned difficulties with cavity first fabrication processes.

FIG. 1 illustrates some embodiments of a cross-sectional view of a disclosed integrated chip 100 having micro-electromechanical (MEMS) devices.

The integrated chip 100 comprises a CMOS substrate 101 having a semiconductor substrate 102 with one or more transistor devices 104 disposed therein. In some embodiments, the one or more transistor devices 104 may be formed by way of a CMOS (complementary metal oxide semiconductor) fabrication process. A back-end-of-the-line (BEOL) metal stack is disposed over the CMOS substrate 101. The BEOL metal stack comprises a plurality of metal interconnect layers 105. The plurality of metal interconnect layers 105 are coupled to the one or more transistor devices 104, which are disposed within a dielectric material 106 comprising one or more dielectric layers. Typically, the plurality of metal interconnect layers 105 comprise metal layers that increase in size as a distance from the semiconductor substrate 102 increases, thereby allowing the one or more transistor devices 104 to be connected to off-chip elements.

A plurality of openings 107 are disposed within a top surface 106t of the dielectric material 106. The plurality of openings 107 expose an upper metal interconnect layer 105u of the BEOL metal stack. In some embodiments, one or more bonding pads 116 are disposed within one or more of the plurality of openings 107 in a manner that causes the one or more bonding pads 116 to electrically contact the upper metal interconnect layer 105u. The one or more bonding pads 116 provide for an electrical connection between the BEOL metal stack and external circuitry. In some embodiments, the bonding pads 116 underlie openings 124 extending through overlying structures.

A conductive MEMS substrate 110 (e.g., having a doping concentration that results in a resistivity of approximately 0.01 ohm-cm) is arranged over the CMOS substrate 101. The MEMS substrate 110 comprises one or more MEMS devices (e.g., a pressure sensor, an accelerometer, a gyroscope, etc.) having malleable, soft mechanical structures, 118a and 118b. In some embodiments, the soft mechanical structures, 118a and 118b, comprise one or more openings 111 vertically extending through the MEMS substrate 110. In some embodiments, some the one or more openings 111 extend through the soft-mechanical structures 118a and 118b, to allow for movement of the soft mechanical structures, 118a and 118b (e.g., causing the soft mechanical structures to act as a spring). In some embodiments, some the one or more openings 111 are laterally offset from the soft-mechanical structures 118a and 118b, to allow provide for electrical isolation within the MEMS substrate 110.

In some embodiments, the soft mechanical structures, 118a and 118b, are arranged over an electrode 105e, disposed within the upper metal interconnect layer 105u, which abuts one of the plurality of openings 107. The electrode 105e is configured to measure a variable capacitance caused by movement of the soft mechanical structures, 118a and 118b. In some embodiments, an anti-stiction stopper 126 may be disposed onto an exposed surface of the electrode 105e to prevent stiction between the soft mechanical structures, 118a and 118b, and the electrode 105e.

A bonding structure 108 is disposed onto a first side of the MEMS substrate 110, facing the CMOS substrate 101 at locations laterally offset from the one or more soft mechanical structures, 118a and 118b. The bonding structure 108 extends through one or more of the plurality of openings 107 within the dielectric material 106, so that the bonding structure 108 abuts the upper metal interconnect layer 105u. The bonding structure 108 comprises one or more electrically conductive layers, which provide for an electrical connection between the MEMS substrate 110 and the CMOS substrate 101.

In some embodiments, the bonding structure 108 may be formed from a plurality of bonding layers that allow for a low-temperature bond (e.g., having a bonding temperature of less than or equal to approximately 400° C.) between the MEMS substrate 110 and the CMOS substrate 101. In various embodiments, the low-temperature bond may comprise a eutectic bond or a solid-liquid interdiffusion bond (SLID). In some additional embodiments, the bonding structure 108 may also comprise an alloy have a relatively high melting temperature that enables a back-end-of-the-line packing process to be performed without melting the bonding structure 108. For example, in some embodiments, during bonding the plurality of bonding layers may form an intermetallic compound having a higher melting temperature than one or more of the plurality of bonding layer (e.g., a melting temperature of greater than or equal to approximately 300° C.).

A carrier substrate 114 may be disposed over the MEMS substrate 110. The carrier substrate 114 may comprise one or more cavities, 120a and 120b, which are arranged over the soft mechanical structures, 118a and 118b. In some embodiments, an anti-stiction bump 122 may be arranged on a top surface of the one or more cavities, 120a and 120b. The bonding structure 108 is configured to form a hermetic seal that separates the one or more cavities, 120a and 120b, from an ambient environment surrounding the integrated chip 100. The one or more cavities, 120a and 120b, allow the soft mechanical structures, 118a and 118b, to move freely within a controlled environment (e.g., pressure) of a cavity.

A dielectric layer 112 is arranged between the MEMS substrate 110 and the carrier substrate 114. The dielectric layer 112 is laterally set back from sidewalls of the one or more cavities, 120a and 120b. For example, the dielectric layer 112 may be set back by a distance $d_1$ from a sidewall of the one or more cavities, 120a and 120b. The dielectric layer 112 is also laterally set back from sidewalls of one or more openings 111 extending through the MEMS substrate 110. For example, the dielectric layer 112 may be set back by a distance $d_2$ from the sidewall of the one or more openings 111. In some embodiments, $d_1$ is a distance that is greater than or equal to $d_2$. In other embodiments, $d_1$ is a distance that is less than or equal to $d_2$.

Figure 2:
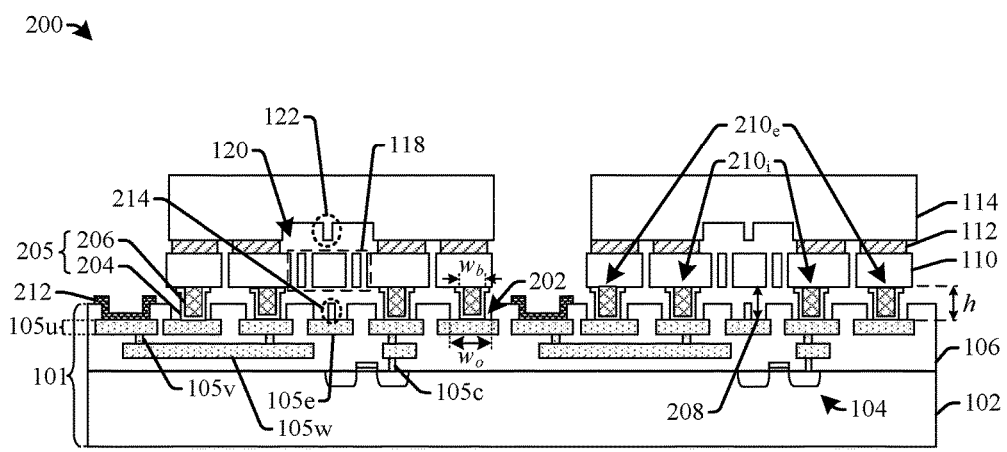
FIGS. 2-3 illustrate cross-sectional views of some additional embodiments of a disclosed integrated chip having MEMS devices.

FIG. 2 illustrates a cross-sectional view of some additional embodiments of a disclosed integrated chip 200 having MEMS devices.

Integrated chip 200 includes a CMOS substrate 101 comprising a semiconductor substrate 102 and an overlying BEOL metal stack. In various embodiments, the semiconductor substrate 102 may comprise any type of semiconductor body (e.g., silicon, SiGe, SOI) such as a semiconductor wafer and/or one or more die on a wafer, as well as any other type of metal layer, device, semiconductor and/or epitaxial layers, etc., associated therewith. The BEOL metal stack comprises a plurality of metal interconnect layers 105 disposed within a dielectric material 106. The dielectric material 106 may comprise one or more dielectric layers comprising one or more of silicon dioxide ($SiO_2$), a low-k dielectric material, or an ultra low-k (ULK) dielectric material. In some embodiments, the one or more dielectric layers may be vertically separated by an etch stop layers (e.g., SiN etch stop layers)(not shown). The plurality of metal interconnect layers 105 comprise alternating layers of vertical interconnections and lateral interconnection. For example, a metal contact 105c that provides for a vertical connection may be connected to a transistor device 104 disposed within the semiconductor substrate 102, a first metal wire layer 105w that provides for a lateral connection may be disposed above the metal contact 105c, a first via layer 105v that provides for a vertical connection may be disposed over the first metal wire layer 105w, etc. In various embodiments, the metal interconnect layers may comprise one or more of aluminum (Al), copper (Cu), or tungsten (W), for example.

The CMOS substrate 101 is connected to an overlying MEMS substrate 110 by way of a bonding structure 205. The bonding structure 205 extends from the MEMS substrate 110 to upper metal interconnect layer 105u. In some embodiments, the bonding structure 205 has a tapered profile that changes from a first width abutting the MEMS substrate 110 to a smaller width $w_b$ in a lower part of the bonding structure 205. In some embodiments, the openings 202 have a width $w_o > w_b$, which allows for the lower part of the bonding structure 205 to be inserted into the openings 202. The smaller width $w_b$ of the lower part of the bonding structure 205 allows for a height h of the bonding structure 205 to be substantially equal to a sensing gap 208 between electrode 105e and the soft mechanical structures 118 of the MEMS devices. For example, by increasing a thickness of the bonding structure 205, the height h is increased and the sensing gap 208 is also increased. In contrast, by decreasing a thickness of bonding structure 205, the height h is decreased and the sensing gap 208 is also decreased.

The bonding structure 205 may comprise an intermetallic compound having a plurality of metallic elements. In some embodiments, the intermetallic compound may comprise one or more of copper (Cu), tin (Sn), gold (Au), indium (In), or titanium (Ti). For example, the intermetallic compound may comprise CuSn, AuSn, or AuIn and titanium may act as an adhesive layer to improve adhesion of the intermetallic compound. In such embodiments, the bonding structure 205 may comprise a CuSn—Cu bond, a CuSn—CuSn bond, an AuSn—Au bond, or an AuIn—Au bond.

In some embodiments, the intermetallic compound may be comprised within a first bonding layer 204 abutting a second bonding layer 206 comprising a dielectric material (e.g., an oxide). The first bonding layer 204 abuts the upper metal interconnect layer 105u and the MEMS substrate 110, and the second bonding layer 206 abuts the first bonding layer 204 and the MEMS substrate 110. In some embodiments, the first bonding layer 204 abuts a lower surface and sidewalls of the second bonding layer 206. Although the bonding layers shown herein (e.g., in FIGS. 2-6) are illustrated as separate bonding layers, it will be appreciated that the separate bonding layers may comprise atoms from other bonding layers (e.g., adjacent bonding layers), which diffuse during a bonding process. For example, bonding layer 204 may comprise atoms from bonding layer 206, and vice versa.

In some embodiments, the bonding structure 205 may comprise interior bonding structures 210i and exterior bonding structures 210e. In some embodiments, the interior bonding structures 210i are configured to form an electrical connection between the MEMS substrate 110 and the CMOS substrate 101. The exterior bonding structures 210e are configured to form a hermetic seal that isolates the cavities 120 from an ambient environment. For example, in some embodiments, the interior bonding structures 210i may non-continuously enclose the cavities 120, while the exterior bonding structures 210e may continuously enclose the cavities 120.

In some embodiments, one or more bonding pads 212 are arranged over the upper metal interconnect layer 105u and may comprise aluminum and/or copper. For example, the one or more bonding pads 212 may comprise an aluminum-copper alloy. In some embodiments, an anti-stiction stopper 214 may be disposed onto top surfaces of the one or more electrodes 105e. In some embodiments, the anti-stiction stopper 214 may comprise a same material as the dielectric material 106. For example, the dielectric material 106 and the anti-stiction stopper 210 may comprise silicon dioxide ($SiO_2$).

Figure 3:
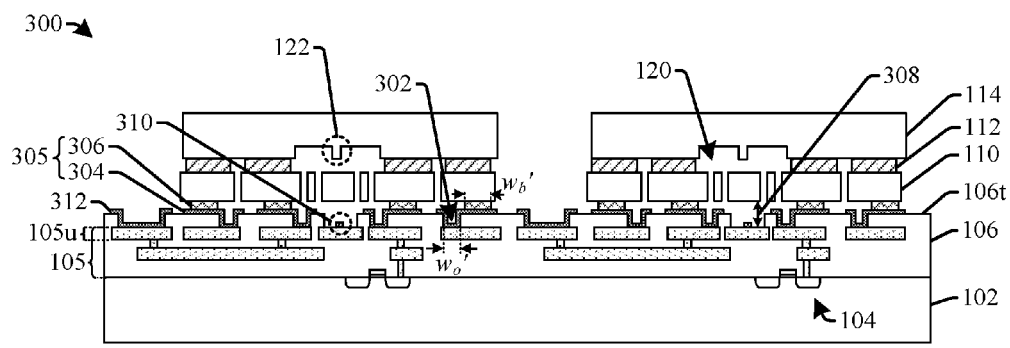

FIG. 3 illustrates a cross-sectional view of some additional embodiments of a disclosed integrated chip 300 having MEMS devices.

Integrated chip 300 comprises a bonding structure 305 having first bonding layer 304 and a second bonding layer 306. The first bonding layer 304 is disposed onto interior surfaces of openings 302 in the dielectric material 106, which expose the upper metal interconnect layer 105u. The first bonding layer 304 extends from the upper metal interconnect layer 105u to a top surface 106t of the dielectric material 106 and acts as a routing layer that provides for an electrical connection between the upper metal interconnect layer 105u and a second bonding layer 306 abutting the MEMS substrate 110 at positions overlying the top surface 106t of the dielectric material 106. In some embodiments, a width $w_b'$ of the second bonding layer 306 is greater than a width $w_o'$ of the openings 302. In such embodiments, the sensing gap 308 may be equal to a sum of a thickness of the first bonding layer 304 over the dielectric material 106, a thickness of the second bonding layer 306, and a depth of the openings 302.

In some embodiments, the bonding structure 305 comprises a eutectic bond between the first bonding layer 304 and the second bonding layer 306. In some embodiments, the first bonding layer 304 may comprise one or more of germanium (Ge) or silicon (Si) and the second bonding layer may comprise gold (Au). The resulting eutectic bond may cause the bonding structure 305 to comprise an Au—Ge bond or an Au—Si bond (e.g., formed by a first bonding layer 304 comprising Au and a second bonding layer 306 comprising Ge or Si).

In some embodiments, a bonding pad 312 may comprise a same material as the first bonding layer 304. In some embodiments, an anti-stiction stopper 310 disposed onto an electrode 105e may also comprise the same material as the first bonding layer 304. For example, the bonding pad 312 and the anti-stiction stopper 310 may comprise gold.

Figure 4A:
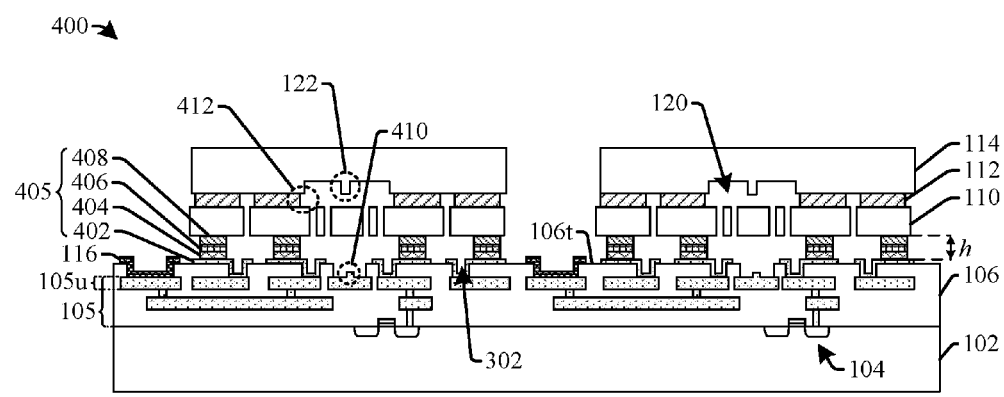
FIGS. 4a-4g illustrate cross-sectional views of some alternative embodiments of a disclosed integrated chip having MEMS devices.

FIG. 4a illustrates a cross-sectional view of some additional embodiments of a disclosed integrated chip 400 having MEMS devices.

Integrated chip 400 comprises a bonding structure 405 having a first bonding layer 402, a second bonding layer 404, a third bonding layer 406, and a fourth bonding layer 408. The first bonding layer 402 is in contact with an upper metal interconnect layer of the BEOL metal stack. The first bonding layer 402 extends from the upper metal interconnect layer 105u to a top surface 106t of the dielectric material 106 and acts as a routing layer that provides for an electrical connection between the upper metal interconnect layer 105u and the second bonding layer 404. The second bonding layer 404 abuts the third bonding layer 406, which abuts the fourth bonding layer 408. The second bonding layer 404, the third bonding layer 406, and the fourth bonding layer 408 may have sidewalls that are substantially aligned.

The bonding structure 405 may comprise an intermetallic compound having a plurality of metallic elements. In some embodiments, the intermetallic compound may comprise copper (Cu), tin (Sn), gold (Au), indium (In), or titanium (Ti). For example, the intermetallic compound may comprise CuSn, AuSn, or AuIn and titanium may act as an adhesive layer to improve adhesion of the intermetallic compound. Such intermetallic compounds may cause the bonding structure 405 to comprise a CuSn—Cu bond, a CuSn—CuSn bond, an AuSn—Au bond, or an AuIn—Au bond. In some embodiments, the intermetallic compound may be disposed at an interface between two of the plurality of bonding layers 402-408. In some embodiments, the fourth bonding layer 408 may comprise copper (Cu) within the openings 302.

In some embodiments, an anti-stiction stopper 410 is disposed onto one or more electrodes 105e and may comprise a same material as the upper metal interconnect layer 105u. For example, the upper metal interconnect layer 105u and the anti-stiction stopper 410 may comprise copper or aluminum.

FIGS. 4b-4g are cross-sectional profiles, 412b-412g, of some more detailed embodiments of the dielectric layer 112 disposed between the MEMS substrate 110 and the carrier substrate 114, in an area 412 shown in FIG. 4a. The dielectric layer 112 has a thickness of T and a lateral variation (i.e., a lateral variation between a rightmost and a leftmost point of a dielectric layer profile) of L. In some embodiments, the profile of the dielectric layer 112 may have a ratio of variation in width (Δw) to thickness (t), which is between approximately 0.01 and approximately 4 (i.e., 0.01≤Δw/t≤4).

It will be appreciated that the cross-sectional profile of the dielectric layer 112 may vary depending upon a number of parameters (e.g., a position of the MEMS substrate and the carrier substrate, a quality of the bonding process, etc). The cross-sectional profiles shown in FIGS. 4b-4g a are not limiting, but are included to illustrates some examples of cross-sectional profiles of a dielectric layer 112 that may be achieved by the present disclosure.

Figure 4B:
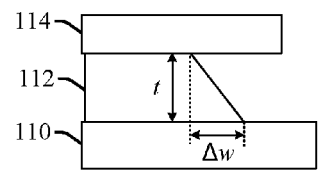
Figure 4C:
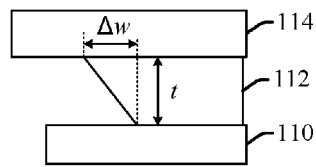

FIGS. 4b-4c illustrate cross-sectional profiles showing a dielectric layer 112 with a relatively weak bonding strength, which has a sidewall with a substantially constant slope. In some embodiments, shown in cross-sectional profile 412b, the carrier substrate 114 undercuts the MEMS substrate 110 (e.g., so that a sidewall of a cavity in the carrier substrate 114 is laterally offset from a sidewall of a hole extending through the MEMS substrate 110). Such a configuration causes the dielectric layer 112 to slope away from the carrier substrate 114 as the dielectric layer 112 gets closer to the MEMS substrate 110. In other embodiments, shown in cross-sectional profile 412c, the carrier substrate 114 overhangs the MEMS substrate 110. Such a configuration causes the dielectric layer 112 to slope away from the MEMS substrate 110 as the dielectric layer 112 gets closer to the carrier substrate 114.

Figure 4D:
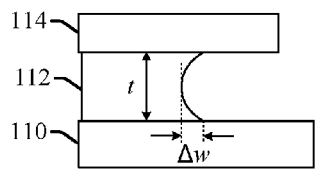
Figure 4E:
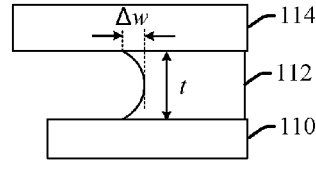

FIGS. 4d-4e illustrate cross-sectional profiles showing a dielectric layer 112 with a relatively strong bonding strength, which has a curved sidewall. The relatively strong bonding strength causes the dielectric layer 112 to abut the carrier substrate 114 and the MEMS substrate 110 at positions that are substantially laterally aligned, regardless of whether the MEMS substrate 110 overhangs the carrier substrate 114 (shown in cross-sectional profile 412d) or the carrier substrate 114 overhangs the MEMS substrate 110 (shown in cross-sectional profile 412e).

Figure 4F:
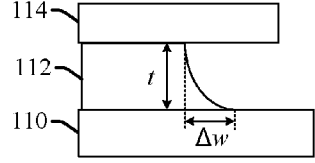
Figure 4G:
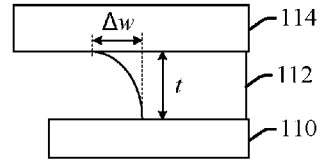

FIGS. 4f-4g illustrate cross-sectional profiles showing a dielectric layer 112 with a relatively weak bonding strength, which has a curved sidewall. In some embodiments, shown in cross-sectional profile 412f, the MEMS substrate 110 overhangs the carrier substrate 114, causing the dielectric layer 112 to have a curve with a slope that increases as a distance from the carrier substrate 114 decreases. In other embodiments, shown in cross-sectional profile 412g, the carrier substrate 114 overhangs the MEMS substrate 110, causing the dielectric layer 112 to have a curve with a slope that decrease as a distance from the carrier substrate 114 decreases.

Figure 5:
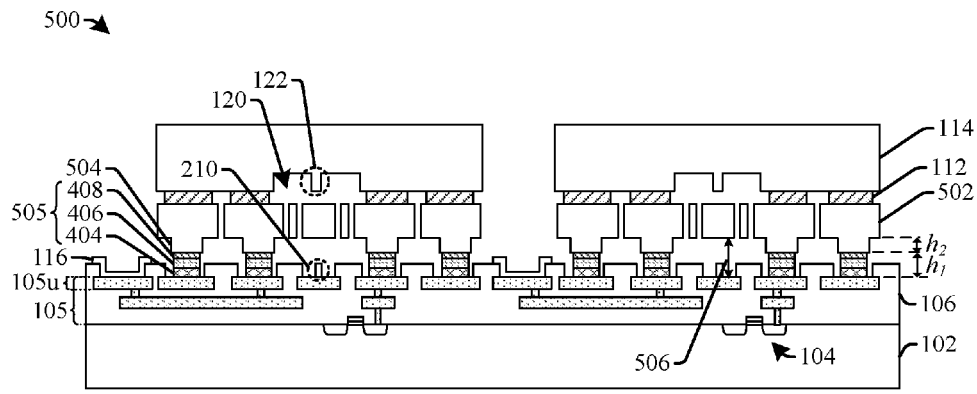
FIGS. 5-6 illustrate cross-sectional views of some additional embodiments of a disclosed integrated chip having MEMS devices.

FIG. 5 illustrates a cross-sectional view of some additional embodiments of a disclosed integrated chip 500 having MEMS devices.

Integrated chip 500 includes a CMOS substrate 101 connected to an overlying MEMS substrate 502 by way of a bonding structure 505 comprising plurality of bonding layers 404-408. A first side of the MEMS substrate 502, facing the CMOS substrate 101, may comprise one or more protrusions 504 that vertically extend below the soft mechanical structures 118. The one or more protrusions 504 are laterally aligned with the one or more of the plurality of openings 107 in the dielectric material 106. The bonding structure 505 is disposed between the one or more protrusions 504 and upper metal interconnect layer 105u. The sensing gap 506 of the soft mechanical structure 118 is equal to a sum of a height $h_1$ of the bonding structure 505 and a height $h_2$ of the one or more protrusions 504, so that by varying a height $h_2$ of the one or more bumps, a size of the sensing gap 506 can be varied.

Figure 6:
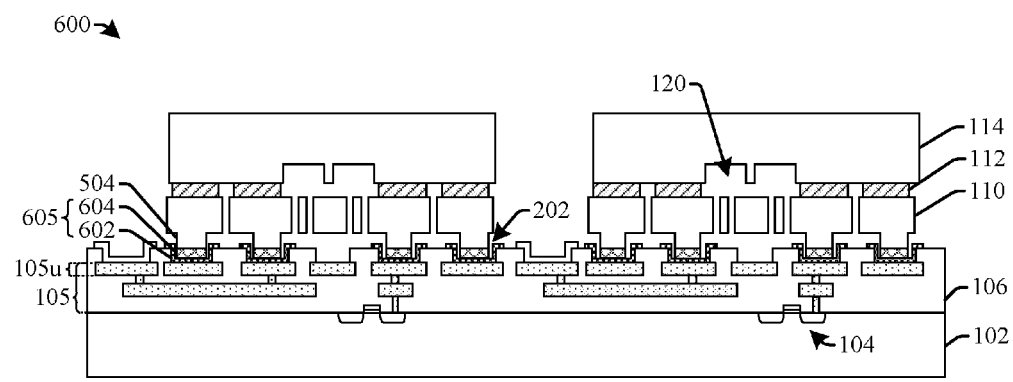

FIG. 6 illustrates some additional embodiments of a cross-sectional view of a disclosed integrated chip 600 having MEMS devices.

Integrated chip 600 comprises a bonding structure 605 having a first bonding layer 602 that abuts interior surfaces of the plurality of openings 202 in the dielectric material 106 and a second bonding layer 604 that is disposed between the first bonding layer 602 and the one or more protrusions 504. The second bonding layer 604 is disposed within the plurality of openings 202. In some embodiments, the second bonding layer 604 may have sidewalls that are substantially aligned with edges of the one or more protrusions 504.

In some embodiments, the bonding structure 605 comprises a eutectic bond between the first bonding layer 602 and the second bonding layer 604. In some embodiments, the first bonding layer 602 may comprise one or more of germanium (Ge) or silicon (Si) and the second bonding layer may comprise gold (Au). The resulting eutectic bond may cause the bonding structure 605 to comprise an Au—Ge bond or an Au—Si bond (e.g., formed by a first bonding layer 602 comprising Au and a second bonding layer 604 comprising Ge or Si).

Figure 7:
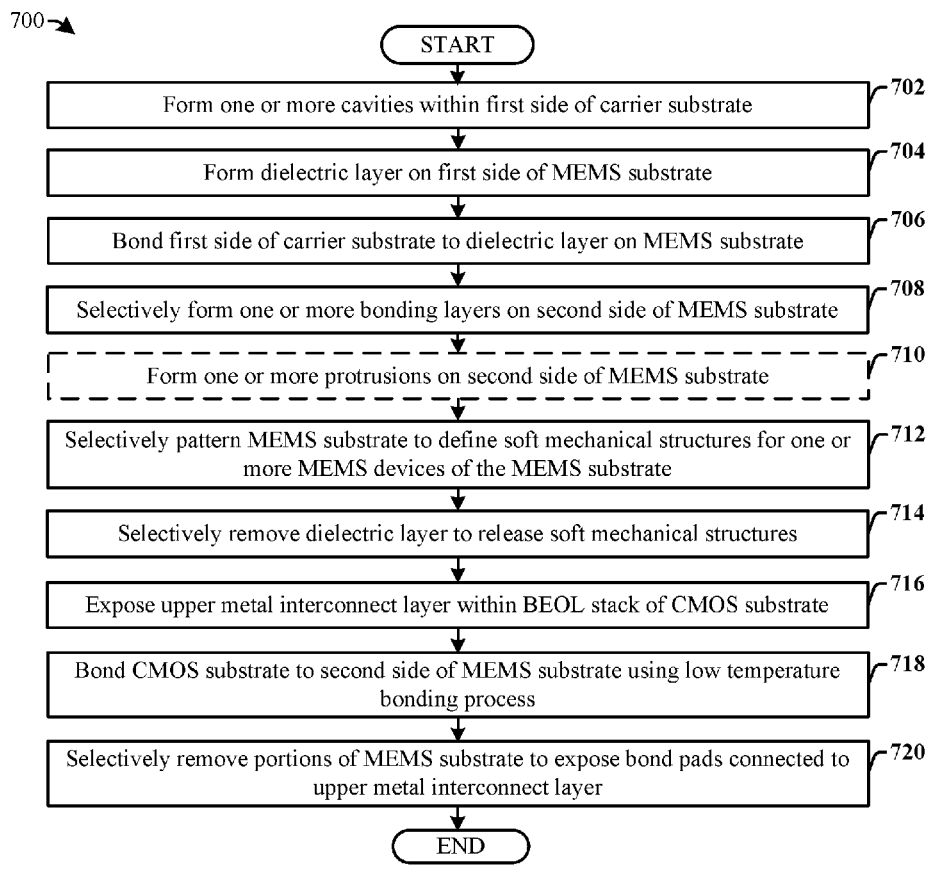
FIG. 7 illustrates a flow diagram of some embodiments of a method of forming a integrated chip having MEMS devices.

FIG. 7 illustrates a flow diagram of some embodiments of a method 700 of forming an integrated chip having MEMS devices.

While disclosed method 700 is illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At 702, one or more cavities are formed within a first side of a carrier substrate. In some embodiments, anti-stiction bumps may be formed within the one or more cavities.

At 704, a dielectric layer is formed on a first side of a MEMS substrate.

At 706, the first side of the carrier substrate is bonded to the dielectric layer on the MEMS substrate.

At 708, one or more bonding layers are formed on a second side of the MEMS substrate.

At 710, one or more protrusions may be formed on a second side of the MEMS substrate, in some embodiments. The second side of the MEMS substrate is opposite the first side of the MEMS substrate.

At 712, the MEMS substrate is selectively patterned to define soft mechanical structures for one or more MEMS devices within the MEMS substrate.

At 714, the dielectric layer is selectively removed to release the soft mechanical structures. In some embodiments, removal of the dielectric layer may be done using a dry release process.

At 716, an upper metal interconnect layer within a back-end-of-the-line (BEOL) metal stack of a CMOS substrate is exposed to an ambient environment. The upper metal interconnect layer is exposed by one or more openings, which are formed at positions that are to be laterally aligned with the one or more bonding layers during subsequent bonding of the MEMS substrate to the CMOS substrate (act 718).

At 718, the CMOS substrate is bonded to the MEMS substrate using a low-temperature bonding process, so as to form an electrical connection between the MEMS substrate and the upper metal interconnect layer. The low-temperature bonding process may have a bonding temperature of less than or equal to approximately 400° C.

At 720, portions of the MEMS substrate may be selectively removed to expose one or more bonding pads overlying the upper metal interconnect layer of the CMOS substrate.

FIGS. 8-17b illustrate some embodiments of cross-sectional views showing a method of forming an integrated chip having MEMS devices. Although FIGS. 8-17b are described in relation to method 700, it will be appreciated that the structures disclosed in FIGS. 8-17b are not limited to such a method, but instead may stand alone as structures independent of the method.

Figure 8:
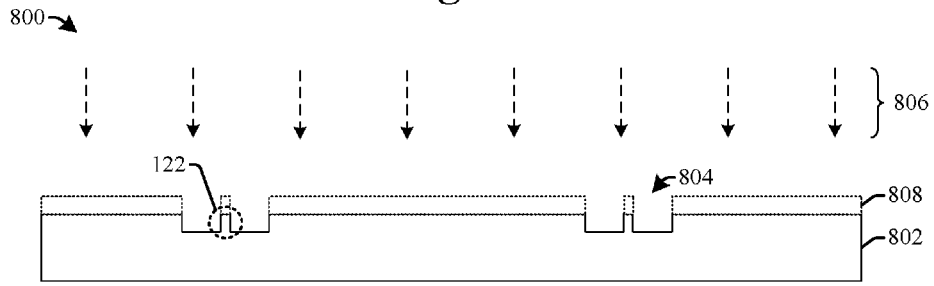
FIGS. 8-17b illustrate cross-sectional views of some embodiments showing a method of forming an integrated chip having MEMS devices.

FIG. 8 illustrates some embodiments of a cross-sectional view 800 of an integrated chip corresponding to act 702.

As shown in cross-sectional view 800, one or more cavities 804 are formed within a carrier substrate 802. The one or more cavities 804 may be formed by selectively exposing the carrier substrate 802 to a first etchant 806 according to a masking layer 808 (e.g., photoresist). In some embodiments, the masking layer 808 may also define one or more anti-stiction bumps 122 within the one or more cavities 804. In some embodiments, the first etchant 806 may comprise a dry etchant. In some embodiments, the dry etchant may have an etching chemistry comprising a fluorine species (e.g., $CF_4$, $CHF_3$, $C_4F_8$, $SF_6$, etc.). In some embodiments, the etching chemistry may further comprise oxygen or hydrogen, for example. In other embodiments, the first etchant 806 may comprise a wet etchant comprising hydroflouric acid (HF).

Figure 9:
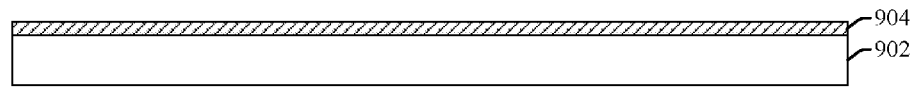

FIG. 9 illustrates some embodiments of a cross-sectional view 900 of an integrated chip corresponding to act 704.

As shown in cross-sectional view 900, a dielectric layer 904 is formed on a first side of a MEMS substrate 902. The dielectric layer 904 may comprise a silicon dioxide ($SiO_2$) layer extending over the one or more cavities 804. In some embodiments, the dielectric layer 904 may be formed on the MEMS substrate 902 using a deposition process. In other embodiments, the dielectric layer 904 may comprise an oxide grown on the MEMS substrate 902 using a thermal oxidation process (e.g., a wet thermal growth process or a dry thermal growth process) or using a deposition process (e.g., PVD, PE-CVD, CVD, etc.).

Figure 10:
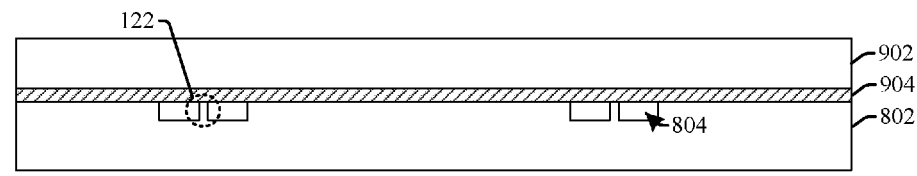

FIG. 10 illustrates some embodiments of a cross-sectional view 1000 of an integrated chip corresponding to act 706.

As shown in cross-sectional view 1000, the carrier substrate 802 is bonded to the dielectric layer 904 on the first side of the MEMS substrate 902. Bonding the carrier substrate 802 to the MEMS substrate 902 causes the one or more cavities 804 in the carrier substrate 802 to abut the dielectric layer 904, so that the MEMS substrate 902 is vertically separated from the one or more cavities 804 by the dielectric layer 904. In some embodiments, a direct bonding process may be used to bond the carrier substrate 802 to the MEMS substrate 906. In other embodiments, a fusion bonding process may be used to bond the carrier substrate 802 to the MEMS substrate 906. In some embodiments, the MEMS substrate 902 may be thinned after the bonding process to reduce a thickness of the MEMS substrate 902. In some embodiments, the MEMS substrate 902 may be thinned to a thickness in a range of between approximately 10 um and approximately 60 um.

Figure 11A:
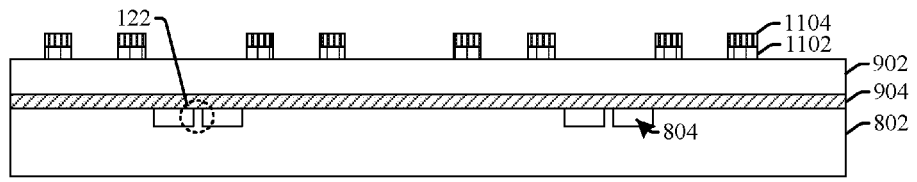
Figure 11B:
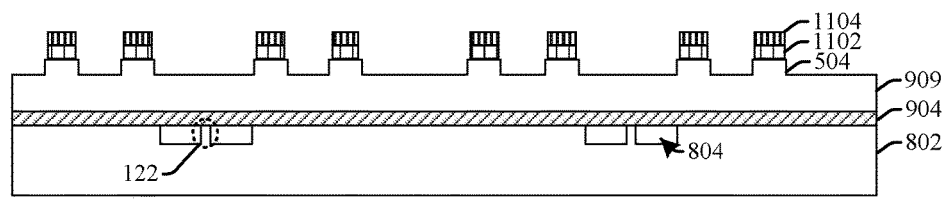

FIGS. 11a-11b illustrate some embodiments of cross-sectional views, 1100a and 1100b, of an integrated chip corresponding to acts 708 and 710.

As shown in cross-sectional view 1100a, one or more bonding layers 1102-1104 are selectively formed onto a second surface of the MEMS substrate 902. Although FIGS. 11a-11b illustrate the one or more bonding layers 1102-1104 as two layers, it will be appreciated that the one or more bonding layers 1102-1104 may be a single bonding layer. In some embodiments, the one or more bonding layers 1102-1104 may comprise one or more materials that have a melting temperature of less than 400° C. to enable the low-temperature bonding process.

In some embodiments, the one or more bonding layers 1102-1104 may be deposited by way of a vapor deposition process (e.g., a CVD process, a PVD process, a PE-CVD process, etc.). In other embodiments, the one or more bonding layers 1102-1104 may be formed by a plating process (e.g., an electroplating process, an electro-less plating process, etc.). After formation, the one or more bonding layers 1102-1104 may be patterned using photolithography and one or more etching steps. In some embodiments, the one or more bonding layers 1102-1104 may comprise one or more of copper (Cu), tin (Sn), gold (Au), indium (In), or titanium (Ti). In other embodiments, the one or more bonding layers 1102-1104 may comprise one or more of germanium (Ge) or silicon (Si).

As shown in cross-sectional view 1100b, one or more protrusions 504 may be formed on a second side of the MEMS substrate 909. The one or more protrusions 504 may be formed by selectively exposing the MEMS substrate 909 to an etchant according to a masking layer (e.g., photoresist). In some embodiments, the etchant may comprise a dry etchant. In various embodiments, the etchant may comprise a dry etchant (e.g., having an etching chemistry $CF_4$, $CHF_3$, $C_4F_8$, etc.) or a wet etchant (e.g., HF). One or more bonding layers 1102-1104 are selectively formed onto the one or more protrusions 504. The one or more bonding layers 1102-1104 may have sidewalls that are substantially aligned with sidewalls of one or more protrusions 504 or sidewalls that are set back from sidewalls of the one or more protrusions 504.

Figure 12:
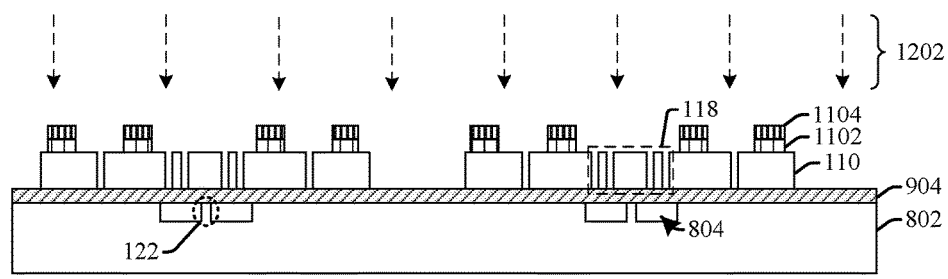

FIG. 12 illustrates some embodiments of a cross-sectional view 1200 of an integrated chip corresponding to act 712.

As shown in cross-sectional view 1200, the MEMS substrate 110 is selectively patterned to define soft mechanical structures 118 of one or more MEMS devices within the MEMS substrate 110. The MEMS substrate 110 may be patterned by selectively exposing the substrate to a second etchant 1202 according to a masking layer (e.g., photoresist)

(not shown). In various embodiments, the second etchant 1202 may comprise a dry etchant. In various embodiments, the second etchant 1202 may comprise a dry etchant (e.g., having an etching chemistry $CF_4$, $CHF_3$, $C_4F_8$, etc.) or a wet etchant (e.g., HF).

Figure 13:
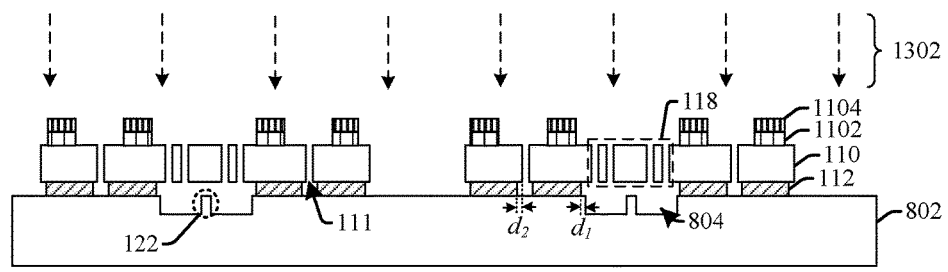

FIG. 13 illustrates some embodiments of a cross-sectional view 1300 of an integrated chip corresponding to act 714.

As shown in cross-sectional view 1300, the dielectric layer 112 is selectively removed to release the soft mechanical structures 118. In some embodiments, removal of the dielectric layer 112 may be done using a dry release process comprising a dry etchant. In some embodiments, the dry release process may use a dry etchant 1302 comprising a dry etching process (e.g., a reactive ion etch, a plasma etch). In other embodiments, the dry release process may use a dry etchant 1302 having vaporized HF. The dry release process prevents stiction between the soft mechanical structures 118 and interior surfaces of the one or more cavities 804.

The release process causes the dielectric layer 112 to be laterally set back from a sidewall of the one or more cavities 804. For example, the dielectric layer 112 may be set back by a distance from the sidewall of the one or more cavities 804. The dielectric layer 112 may be also laterally set back from sidewalls of one or more openings 111 extending through the MEMS substrate 110. For example, the dielectric layer 112 may be set back by a distance $d_1$ from a sidewall of the one or more cavities 804. The dielectric layer 112 is also laterally set back from sidewalls of one or more holes extending through the MEMS substrate 110. For example, the dielectric layer may be set back by a distance $d_2$ from the sidewall of the one or more holes. In some embodiments, $d_1$ is a distance that is greater than or equal to $d_2$. In other embodiments, $d_1$ is a distance that is less than or equal to $d_2$.

Figure 14:
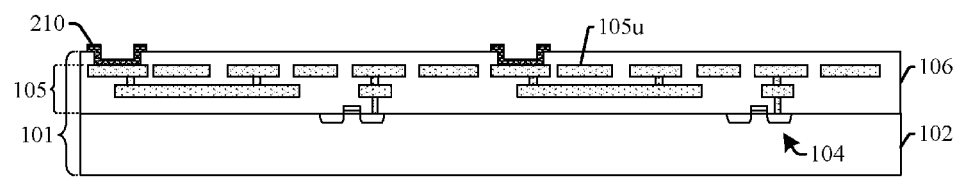

FIG. 14 illustrates some embodiments of cross-sectional views 1400 of an integrated chip corresponding to act 716.

As shown in cross-sectional view 1400, a CMOS substrate 101 is provided, having a semiconductor substrate 102 and an overlying BEOL metal stack. In some embodiments, the one or more transistor devices 104 may be formed within the semiconductor substrate 102 using a CMOS process. In various embodiments, the one or more transistor devices 104 may comprise planar devices and/or FinFET devices. The one or more transistor devices 104 may comprise source and drain regions separated by a channel region. A gate structure, configured to control the flow of charge carrier in the channel region during operation, is separated from the channel region by a gate dielectric. In some the gate structure may comprise polysilicon or a high-K metal gate material (e.g., HfO, $Al_2O_3$, etc.). The BEOL stack comprise a plurality of metal interconnect layers 105 disposed within a dielectric material 106 comprising one or more dielectric layers. The plurality of metal interconnect layers 105 are coupled to the one or more transistor devices 104.

Figure 15A:
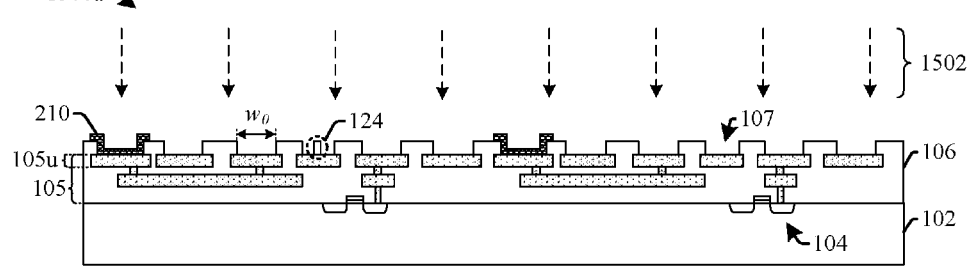
Figure 15B:
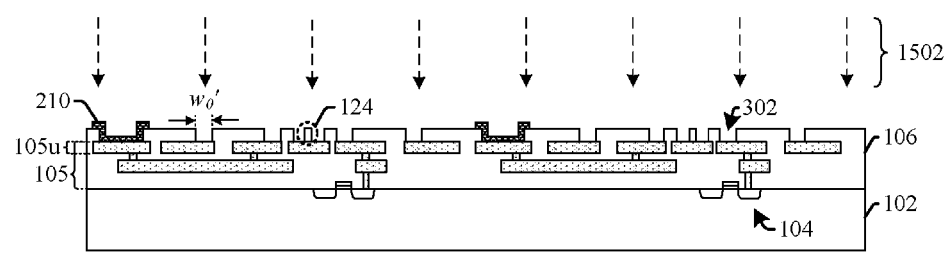

FIGS. 15a-15b illustrate some embodiments of cross-sectional views, 1500a and 1500b, of an integrated chip corresponding to act 716.

As shown in cross-sectional views 1500a-1500b, the dielectric material 106 is selectively removed over an upper metal interconnect layer 105u within the BEOL metal stack to expose sections of the upper metal interconnect layer 105u. In some embodiments, the dielectric material 106 may be removed by selectively exposing the dielectric material 106 to a third etchant 1502. In some embodiments, shown in cross-sectional view 1500a, the dielectric material 106 may be removed to form openings 107 having a first width $w_0$ that is larger than a width of a bonding structure abutting the MEMS substrate 110. In other embodiments, shown in cross-sectional view 1500b, the dielectric material may be removed to form openings 302 having a second width $w_0'$ that is less than a width of a bonding structure abutting the MEMS substrate 110.

Figure 16A:
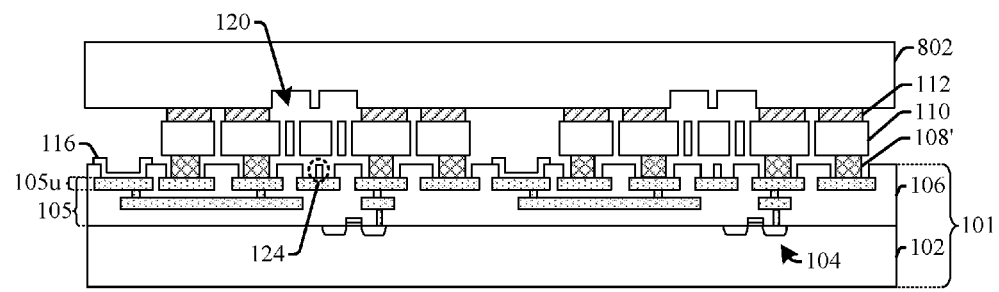
Figure 16B:
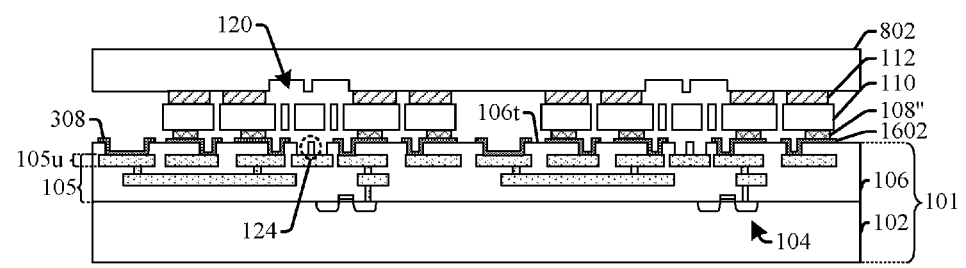

FIGS. 16a-16b illustrate some embodiments of cross-sectional views, 1600a and 1600b, of an integrated chip corresponding to act 718.

As shown in cross-sectional view 1600a, the MEMS substrate 110 is bonded to a CMOS substrate 101 using a low-temperature bonding process. The low-temperature bonding process (e.g., having a temperature of less than 400° C.) forms a bonding structure 108' comprising an intermetallic compound. During the bonding process, the materials of the one or more bonding layers may change (e.g., atoms from one bonding layer may diffuse to another bonding layer) to form an intermetallic compound that is not damaged by a high-temperature back-end-of-the-line packaging process (e.g., to form an intermetallic compound having a melting temperature of greater than 300° C.). For example, adjacent bonding layers comprising titanium (e.g., having a melting temperature of approximately 231° C.) and copper may change to an CuSn intermetallic compound having melting temperature of greater than 300° C. during the bonding process. In various embodiments, the low-temperature bonding process may comprise a solid-liquid interdiffusion (SLID) process or a eutectic bonding process.

In some embodiments, shown in cross-sectional view 1600a, the bonding structure 108' may have substantially linear sidewalls and extend from the second side of the MEMS substrate 110 to the upper metal interconnect layer 105u.

In other embodiments, shown in cross-sectional view 1600b, a bonding layer 1602 is formed onto the MEMS substrate 110 at positions extending into the openings 302. In such embodiments, the bonding layer 1602 may be formed by a deposition process or by a plating process. The bonding structure 108" of the MEMS substrate 110 is subsequently brought into contact with the bonding layer 1602 to bond the MEMS substrate 110 to the CMOS substrate 101. During the bonding process, atoms from the bonding structure 1602 may diffuse into the bonding layer 1602. The bonding layer 1602 acts as a routing layer that electrically couples bonding layer 1602 to the upper metal interconnect layer 105u.

In some embodiments, the bonding layer 1602 may comprise copper (Cu), gold (Au), or titanium (Ti). In some embodiments, the bonding pad 116 may be removed and then subsequently reformed so as to have a same material as the second bonding layer 1602.

Figure 17A:
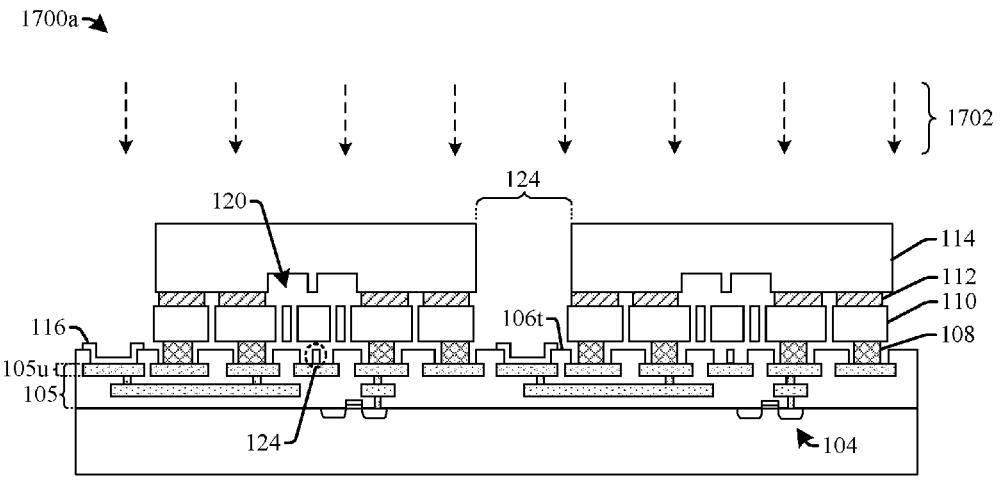
Figure 17B:
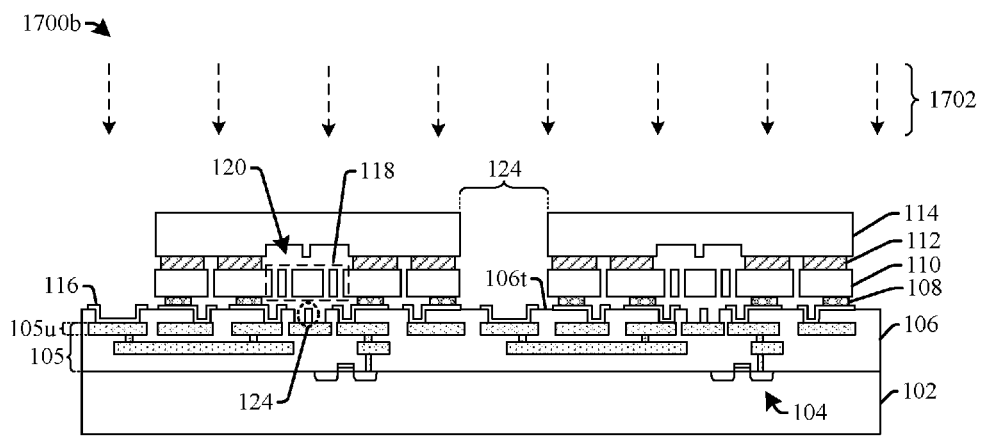

FIGS. 17a-17b illustrate some embodiments of cross-sectional views, 1700a and 1700b, of an integrated chip corresponding to act 720.

As shown in cross-sectional views, 1700a and 1700b, a portion of the carrier substrate 114 is removed in openings 124 overlying the bonding pads 116. In some embodiments, the portion of the carrier substrate 114 is removed by selectively exposing the carrier substrate to a fourth etchant 1702. In various embodiments, the fourth etchant 1702 may comprise a dry etchant (e.g., having an etching chemistry $CF_4$, $CHF_3$, $C_4F_8$, etc.) or a wet etchant (e.g., HF). In other embodiments, the portion of the carrier substrate 114 is removed by grinding or dicing.

Therefore, the present disclosure relates to a method of forming an integrated chip having one or more MEMS devices, and an associated apparatus.

In some embodiments, the present disclosure relates to an integrated chip. The integrated chip comprises a carrier substrate having one or more cavities disposed within a first side of the carrier substrate. A dielectric layer is disposed between the first side of the carrier substrate and a first side of a micro-electromechanical system (MEMS) substrate. The dielectric layer has sidewalls that are laterally set back from sidewalls of openings extending through the MEMs substrate to the one or more cavities. The integrated chip further comprises a bonding structure having an intermetallic compound having a plurality of metallic elements. The bonding structure abuts a second side of the MEMS substrate and is electrically connected to a metal interconnect layer within a dielectric structure disposed over a CMOS substrate.

In other embodiments, the present disclosure relates to an integrated chip. The integrated chip comprises a carrier substrate having one or more cavities disposed within a first side of the carrier substrate. A dielectric layer is disposed between the first side of the carrier substrate and a first side of a micro-electromechanical system (MEMS) substrate. The dielectric layer has sidewalls that are laterally set back from sidewalls of the one or more cavities. The integrated chip further comprises a bonding structure having an intermetallic compound arranged between a second side of the MEMS substrate and a CMOS substrate having one or more transistor devices.

In yet other embodiments, the present disclosure relates to an integrated chip. The integrated chip comprises a carrier substrate having one or more cavities disposed within a first side of the carrier substrate. A dielectric layer is disposed between the first side of the carrier substrate and a first side of a micro-electromechanical system (MEMS) substrate. The integrated chip further comprises a bonding structure having an intermetallic compound that abuts a second side of the MEMS substrate and is electrically connected to a metal interconnect layer within a dielectric structure disposed over a CMOS substrate. The intermetallic compound comprises a plurality of different metal elements respectively having a melting temperature of less than approximately 400° C.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated chip, comprising:
a carrier substrate comprising one or more cavities disposed within a first side of the carrier substrate;
a dielectric layer disposed between the first side of the carrier substrate and a first side of a micro-electromechanical system (MEMS) substrate, wherein the dielectric layer has sidewalls that are laterally set back from sidewalls of openings extending through the MEMs substrate to the one or more cavities, wherein the sidewalls of the dielectric layer have a slope that changes as a function of height; and
a bonding structure comprising an intermetallic compound having a plurality of metallic elements, wherein the bonding structure abuts a second side of the MEMS substrate and is electrically connected to a metal interconnect layer within a dielectric structure disposed over a CMOS substrate.

2. The integrated chip of claim 1, wherein the intermetallic compound has a melting temperature of greater than approximately 300° C.

3. The integrated chip of claim 1, wherein the sidewalls of the dielectric layer have ratio of variation in width to height that is in a range of between approximately 0.01 and approximately 4.

4. The integrated chip of claim 1, wherein the sidewalls of the dielectric layer are laterally set back from sidewalls of the one or more cavities.

5. The integrated chip of claim 1,
wherein the bonding structure comprises a first metal layer electrically connected the metal interconnect layer and a second metal layer arranged between the first metal layer and the MEMs substrate; and
wherein the first metal layer is arranged within a recess in a top surface of the dielectric structure.

6. The integrated chip of claim 5, wherein the first metal layer is arranged along a lower surface and sidewalls of the recess and continuously extends from within the recess to along the top surface of the dielectric structure.

7. The integrated chip of claim 6, wherein the second metal layer contacts the first metal layer over the top surface of the dielectric structure.

8. An integrated chip, comprising:
a carrier substrate comprising one or more cavities disposed within a first side of the carrier substrate;
a dielectric layer disposed between the first side of the carrier substrate and a first side of a micro-electromechanical system (MEMS) substrate, wherein the dielectric layer has sidewalls that are laterally set back from sidewalls of the one or more cavities; and
a bonding structure comprising an intermetallic compound arranged between a second side of the MEMS substrate and a CMOS substrate having one or more transistor devices, wherein the bonding structure comprises a first metal layer electrically connected to a metal interconnect layer within a dielectric structure over the CMOS substrate and a second metal layer arranged between the first metal layer and the MEMs substrate, and wherein the first metal layer is within a recess in a top surface of the dielectric structure.

9. The integrated chip of claim 8, wherein the sidewalls of the dielectric layer are laterally set back from sidewalls of openings extending through the MEMs substrate to the one or more cavities.

10. The integrated chip of claim 8, wherein the sidewalls of the dielectric layer have ratio of variation in width to height that is in a range of between approximately 0.01 and approximately 4.

11. The integrated chip of claim 8, wherein the dielectric layer has a larger setback from the sidewalls of the one or more cavities along the MEMS substrate than along the carrier substrate.

12. The integrated chip of claim 8, wherein the dielectric layer has a larger setback from the sidewalls of the one or more cavities along the carrier substrate than along the MEMs substrate.

13. The integrated chip of claim 8, wherein the sidewalls of the dielectric layer have a middle that is set back from the sidewalls of the one or more cavities by a larger distance than top and bottom edges of the sidewalls.

14. An integrated chip, comprising:
- a carrier substrate comprising one or more cavities disposed within a first side of the carrier substrate;
- a dielectric layer disposed between the first side of the carrier substrate and a first side of a micro-electromechanical system (MEMS) substrate, wherein the dielectric layer has a curved sidewall facing openings extending through the MEMs substrate;
- a bonding structure comprising an intermetallic compound abutting a second side of the MEMS substrate and electrically connected to a metal interconnect layer within a dielectric structure disposed over a CMOS substrate; and
- wherein the intermetallic compound comprises a plurality of different metal elements respectively having a melting temperature of less than approximately 400° C.

15. The integrated chip of claim 14, wherein the bonding structure comprises a first bonding layer comprising gold, and a second bonding layer comprising germanium or silicon.

16. The integrated chip of claim 14, wherein the intermetallic compound comprises one or more of a copper (Cu), gold (Au), tin (Sn), or indium (In).

17. The integrated chip of claim 14, wherein the melting temperature of the intermetallic compound is greater than approximately 300° C.

18. The integrated chip of claim 14, wherein dielectric layer has sidewalls that are laterally set back from sidewalls of openings extending through the MEMs substrate to the one or more cavities.

19. The integrated chip of claim 1, wherein one of the openings extends through the MEMs substrate at a location that is not coupled to the one or more cavities.

20. The integrated chip of claim 8, wherein the sidewalls of the dielectric layer comprise angled sidewalls that are not perpendicular to the first side of the MEMs substrate.

* * * * *